(12) United States Patent
Yun et al.

(10) Patent No.: US 6,448,588 B2
(45) Date of Patent: Sep. 10, 2002

(54) INSULATED GATE BIPOLAR TRANSISTOR HAVING HIGH BREAKDOWN VOLTAGE IN REVERSE BLOCKING MODE

(75) Inventors: Chong Man Yun; Soo-seong Kim, both of Seoul; Young-dae Kwon, Incheon, all of (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 09/790,816

(22) Filed: Feb. 23, 2001

(30) Foreign Application Priority Data

Apr. 4, 2000 (KR) .......................................... 2000-17625

(51) Int. Cl.$^7$ ............................................. H01L 29/74
(52) U.S. Cl. ........................ 257/156; 257/169; 257/168; 257/148
(58) Field of Search ................................. 257/565, 566, 257/567, 572, 585, 591, 592, 156, 169, 168, 148, 149, 155, 914

(56) References Cited

U.S. PATENT DOCUMENTS 5,352,910 A * 10/1994 Muraoka et al. ............ 257/148

FOREIGN PATENT DOCUMENTS

JP          6268226          9/1994

* cited by examiner

Primary Examiner—Olik Chaudhuri
Assistant Examiner—Yennhu B. Huynh
(74) Attorney, Agent, or Firm—Rothwell, Figg, Ernst & Manbeck

(57) ABSTRACT

An insulated gate bipolar transistor having a high breakdown voltage in a reverse blocking mode and a method for fabricating the same are provided. The insulated gate bipolar transistor includes a relatively low-concentration lower buffer layer and a relatively high-concentration upper buffer layer. The low-concentration lower buffer layer contacts a semiconductor substrate having a high concentration of first conductivity type impurities used as a collector region, and the high-concentration upper buffer layer contacts a drift region of a second conductivity type. The conductivity type of the upper buffer layer is second conductivity type impurities, and the conductivity type of the lower buffer layer is substantially intrinsic, or first conductivity type impurities, or second conductivity type impurities. According to the present invention, due to the high-concentration upper buffer layer, the thickness of the drift region can be reduced, and during a forward continuity, a switching speed can be improved. Simultaneously, due the low-concentration lower buffer layer, the breakdown voltage of a device can be increased in a reverse blocking mode.

5 Claims, 5 Drawing Sheets

FI. 5A
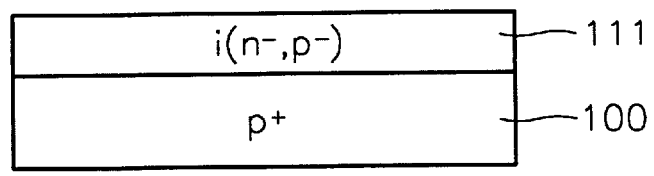
FIG. 5B
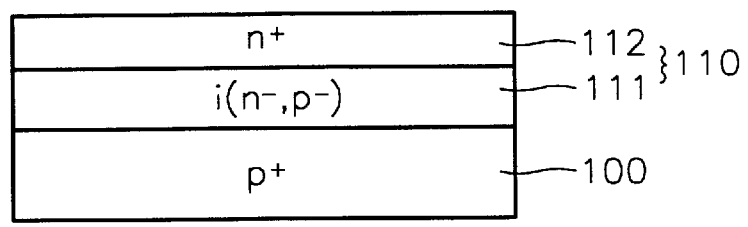
FIG. 5C
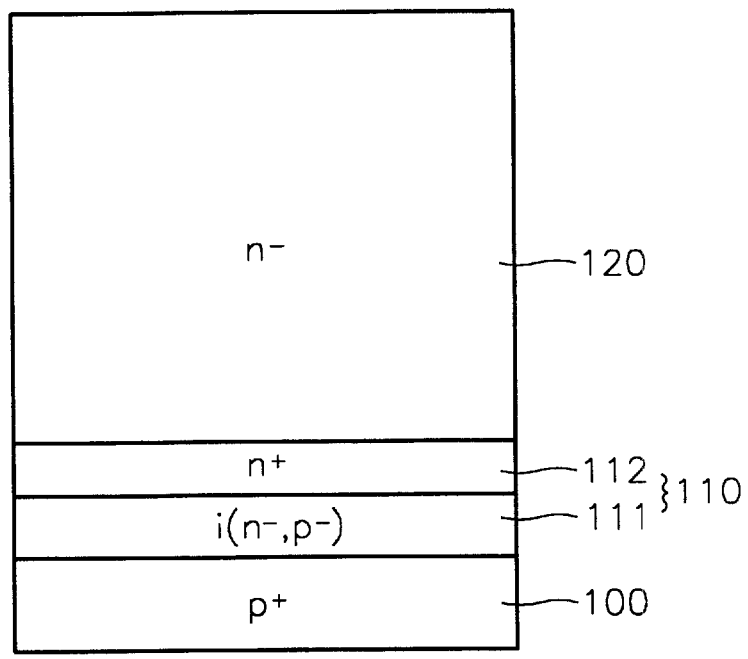

INSULATED GATE BIPOLAR TRANSISTOR HAVING HIGH BREAKDOWN VOLTAGE IN REVERSE BLOCKING MODE

BACKGROUND OF THE INVENTION

1. Field of the Invention

The present invention relates to a power semiconductor device, and more particularly, to an insulated gate bipolar transistor having a high breakdown voltage in a reverse blocking mode and a method for fabricating the same.

2. Description of the Related Art

Recently, an insulated gate bipolar transistor as a new power semiconductor device having high-speed switching characteristics of a high power MOS field effect transistor (MOSFET) and much power characteristics of a bipolar junction transistor (BJT), is very important.

FIG. 1 is a schematic sectional view of the structure of a conventional insulated gate bipolar transistor, and FIG. 2 is a graph illustrating concentration (marked a thin solid line) and a field distribution (marked a thick solid line) on each layer of the insulated gate bipolar transistor of FIG. 1. In FIG. 2, reference numerals "I", "II", "III", and "IV" denote a $p^+$ semiconductor substrate 11, a $n^+$ buffer layer 12, a $n^-$ epitaxial layer 13, and a $p^+$ base region 15, respectively.

Referring to FIG. 1, a region having a high concentration of second conductivity type impurities, for example, a n-type (hereinafter referred to as $n^+$) buffer layer 12 is formed on a region having a high-concentration of first conductivity type impurities used as a collector region, for example, on a p-type (hereinafter referred to as $p^+$) semiconductor substrate 11. A low-concentration n-type (hereinafter referred to as $n^-$) drift region 13 is formed on the n+buffer layer 12. The $n^-$ drift region 13 can be formed by an epitaxial growth method. A $p^+$ base region 14 by the selective diffusion of p-type impurities is formed on a predetermined region of the upper surface of the $n^-$ drift region 13, and a $n^+$ emitter region 15 by the selective diffusion of n-type impurities is formed on a predetermined region of the upper surface of the $p^+$ base region 14.

A gate dielectric layer 16 is formed so as to cover a channel region of the $p^+$ base region 14 between the upper surface of the $n^-$ drift region 13 and the upper surface of the $n^+$ emitter region 15. A gate electrode 17 formed of a polysilicon layer is formed on the gate dielectric layer 16. An emitter electrode 18 is formed so as to be electrically connected to the n-type emitter region, and a collector electrode 19 is formed on a lower region of the $p^+$ semiconductor substrate 11. The gate electrode 17 and the emitter electrode 18 are insulated each other by an oxide film (not shown) functioning as an interdielectric layer.

In the conventional insulated gate bipolar transistor having the above structure, the $n^+$ buffer layer 12 exists for the reason why a reverse voltage is applied between the $n^-$ drift region 13 and the $p^+$ base region 14 in a forward blocking mode in which the gate electrode 17 and the emitter electrode 18 are short-circuited and a positive (+) voltage with respect to the emitter electrode 18 is applied to the collector electrode 19, as this happens, so that a depletion layer formed on a junction between the two regions 13 and 14 may not extend to the $p^+$ semiconductor substrate 11. Thus, the thickness of the $n^-$ drift region 13 can be reduced by the $n^+$ buffer layer 12, as a result, on-state losses of a device can be reduced. During a forward conduction (in a case where a predetermined voltage is applied to the gate of the device, and then a channel is formed), the higher the concentration of the $n^+$ buffer layer 12 is and the larger the thickness of the $n^+$ buffer layer 12 is, hole injection from the $p^+$ semiconductor substrate 11 to the $n^-$ drift region 13 is suppressed, and then, the switching speed of the device is increased.

However, due to the $n^+$ buffer layer 12, the breakdown voltage level of the device is decreased in a reverse blocking mode in which a voltage is not applied to the gate electrode 17 and a negative (−) voltage with respect to the emitter electrode 18 is applied to the collector electrode 19.

More specifically, as shown in FIG. 2, it is evident that the concentration of the $n^+$ buffer layer 12 is high, and as described previously, this is the reason why the larger the concentration of the buffer layer, the more the switching characteristics of the device are improved, and the larger a forward voltage drop is during a forward conduction. Likewise, in the insulated gate bipolar transistor using the $n^+$ buffer layer 12, since the breakdown voltage level which can obtained in a forward blocking mode is the same as the area of a trapezoid drawn by a field distribution, a high breakdown voltage can be obtained. However, the breakdown voltage level which can be obtained in a reverse blocking mode is small as the size of a triangle ($A_1$ of FIG. 2) drawn by the field distribution.

That is, in the reverse blocking mode, the larger the slope of the field is, the higher the concentration of the $n^+$ buffer layer 12 is, and the higher the concentration of the $n^+$ buffer layer 12 is, the smaller the size of the triangle ($A_1$ of FIG. 2) is. Accordingly, the larger the concentration of the $n^+$ buffer layer 12 is, the smaller the breakdown voltage in the reverse blocking mode is.

SUMMARY OF THE INVENTION

To solve the above problems, it is an object of the present invention to provide an insulated gate bipolar transistor in which the improved electrical characteristics of a device obtained by a high doping concentration buffer layer can be maintained, and a high breakdown voltage can be maintained in a reverse blocking mode.

It is another object of the present invention to provide a method for fabricating the insulated gate bipolar transistor.

Accordingly, to achieve the above object, there is provided an insulated gate bipolar transistor. The insulated gate bipolar transistor includes a semiconductor substrate having a high concentration of first conductivity type impurities, a buffer layer formed of an upper buffer layer having a first doping concentration of second conductivity type impurities, which is formed over the semiconductor substrate, and a lower buffer layer having a second doping concentration lower than the first doping concentration, which is formed between the upper buffer layer and the semiconductor substrate, a drift region of a second conductivity type formed on the upper buffer layer, a base region of a first conductivity type formed in a predetermined region of the drift region, an emitter region of a second conductivity type formed in the surface of a predetermined region of the base region, a gate dielectric layer formed on a channel region of the base region, a gate electrode formed on the gate dielectric layer, an emitter electrode formed so as to be electrically connected to the emitter region, and a collector electrode formed so as to be electrically connected to the semiconductor substrate.

Preferably, the first doping concentration of the upper buffer layer is $10^{16}$~$10^{18}$cm$^{-3}$, and the second doping concentration of the lower buffer layer is $10^{12}$~$10^{15}$cm$^{-3}$.

Preferably, the conductivity type of the lower buffer layer is first conductivity type impurities or second conductivity type impurities, and more particularly, the conductivity type of the lower buffer layer is substantially intrinsic.

In order to achieve another object, according to one aspect of the present invention, there is provided a method for fabricating an insulated gate bipolar transistor. The method for fabricating an insulated gate bipolar transistor comprises the steps of: preparing a semiconductor substrate having a high concentration of first conductivity type impurities; sequentially-forming a lower buffer layer having a first doping concentration on the semiconductor substrate and an upper buffer layer having a second doping concentration higher than the first doping concentration; and forming a drift region of a second conductivity type on the upper buffer layer.

The step of forming the lower buffer layer and the upper buffer layer is performed by an epitaxial growth method.

Preferably, first conductivity type impurities or second conductivity type impurities are used as the impurities of the lower buffer layer, and the conductivity type of the lower buffer layer is intrinsic.

Preferably, the first doping concentration of the upper buffer layer is $10^{16}\sim10^{18}cm^{-3}$, and the second doping concentration of the lower buffer layer is $10^{12}\sim10^{15}cm^{-3}$.

In order to achieve another object, according to another aspect of the present invention, there is provided a method for fabricating an insulated gate bipolar transistor. The method for fabricating an insulated gate bipolar transistor comprises the steps of: preparing a first semiconductor substrate having a high concentration of first conductivity type impurities used as a collector region; forming a low doping concentration buffer layer on an upper region of the first semiconductor substrate; preparing a second semiconductor substrate having a low concentration of second conductivity type impurities used as a drift region; forming a high doping concentration buffer layer of a second conductivity type on a lower region of the second semiconductor substrate; and attaching the first semiconductor substrate, on which the low-concentration buffer layer is formed, and the second semiconductor substrate, on which the high-concentration buffer layer is formed, so that the low-concentration buffer layer and the high-concentration buffer layer contact each other.

Preferably, the step of forming the low doping concentration buffer layer of the first semiconductor substrate and the high doping concentration buffer layer of the second semiconductor substrate is performed by an ion implantation method and a thermal diffusion method. Preferably, the step of attaching the first semiconductor substrate and the second semiconductor substrate is performed by a silicon direct bonding method.

Preferably, first conductivity type impurities or second conductivity type impurities are used as the impurities of the low doping concentration buffer layer.

Preferably, the concentration of the high-concentration buffer layer is $10^{16}\sim10^{18}cm^{-3}$, and the concentration of the low doping concentration buffer layer is $10^{12}\sim10^{15}cm^{-3}$.

BRIEF DESCRIPTION OF THE DRAWINGS

The above objects and advantages of the present invention will become more apparent by describing in detail preferred embodiments thereof with reference to the attached drawings in which:

FIGS. 5A through 5C are sectional views illustrating a method for fabricating the insulated gate bipolar transistor according to the present invention;

DETAILED DESCRIPTION OF THE INVENTION

Figure 4:
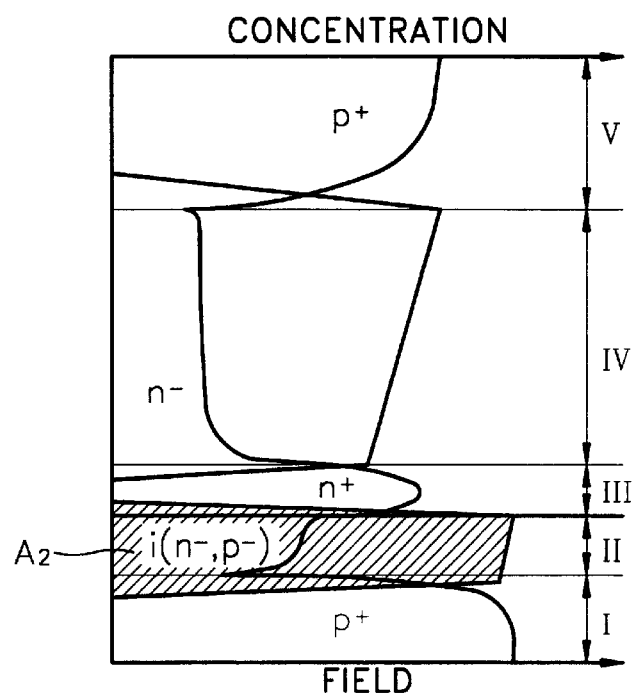
FIG. 4 is a graph illustrating concentration and a field distribution on each region of the insulated gate bipolar transistor of FIG. 3.

In FIG. 4, reference numerals "I", "II", "III", "IV", and "v" denote a $p^+$ semiconductor substrate 100, a lower buffer layer 111 of a buffer layer 100, an upper buffer layer 112 of the buffer layer 100, a $n^-$drift region 120, and a p base region 130, respectively.

Figure 1:
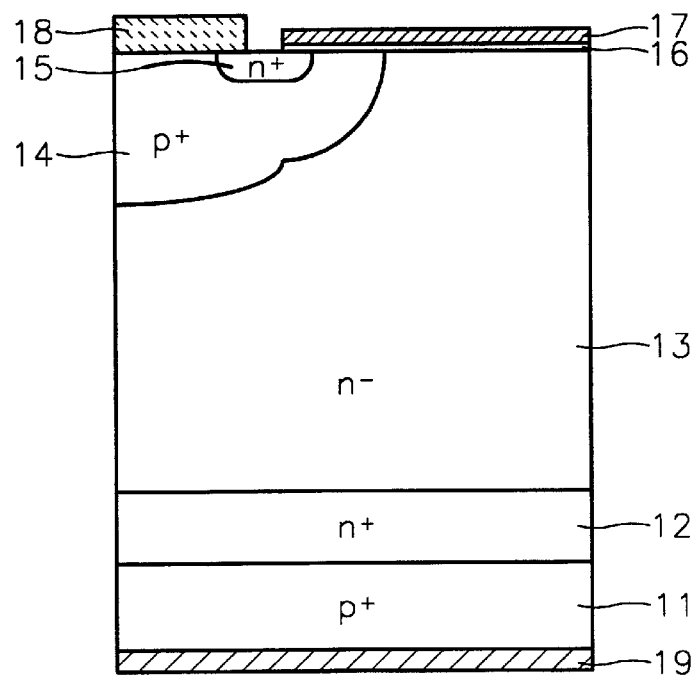
FIG. 1 is a schematic sectional view of the structure of a conventional insulated gate bipolar transistor.
Figure 2:
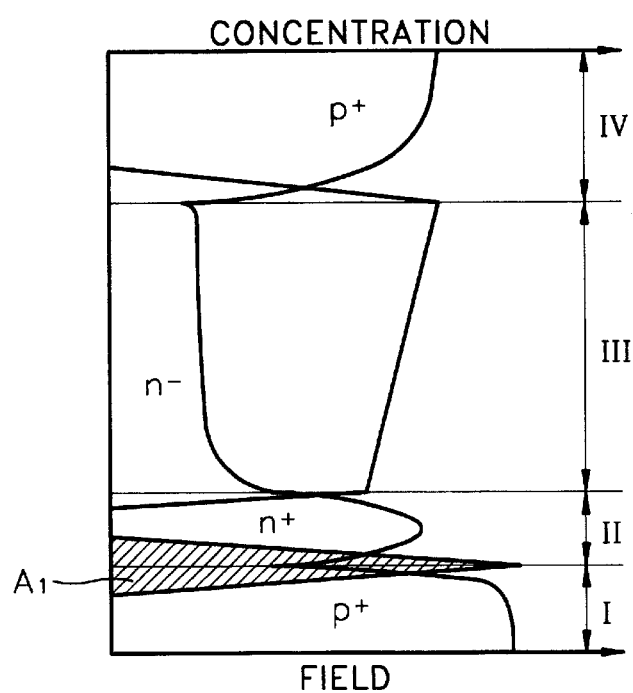
FIG. 2 is a graph illustrating concentration and a field distribution on each region of the insulated gate bipolar transistor of FIG. 1.
Figure 3:
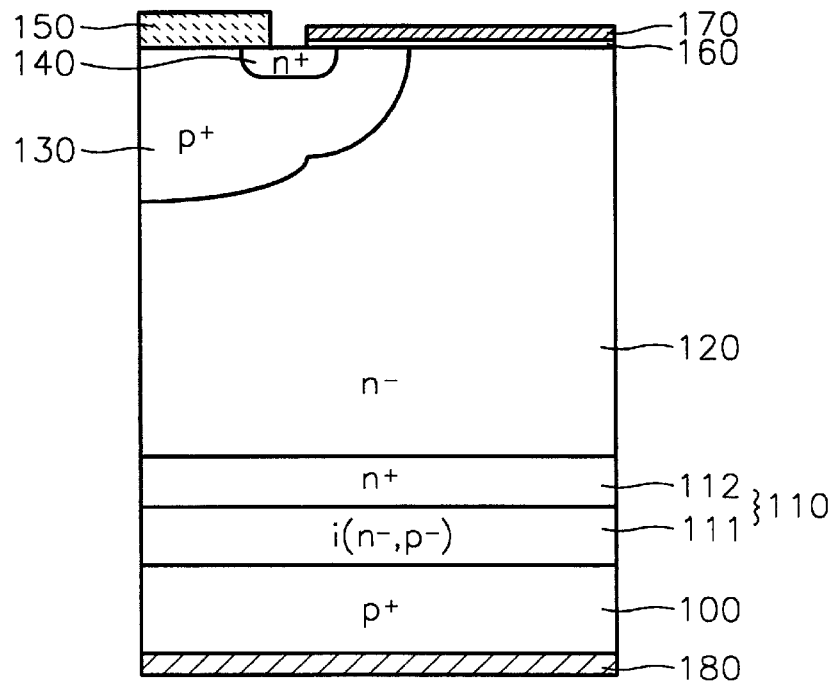
FIG. 3 is a sectional view of the structure of an insulated gate bipolar transistor according to the present invention.

Referring to FIG. 3, the insulated gate bipolar transistor according to the present invention uses $p^+$ semiconductor substrate 100 as a collector region. A buffer layer 110 is formed on the $p^+$ semiconductor substrate 100. The buffer layer 110 is formed of a lower buffer layer 111 contacting the $p^+$ semiconductor substrate 100 and an upper buffer layer 112 located on the lower buffer layer 111.

The upper buffer layer 112 has a very high doping concentration as n-type. On the contrary, the lower buffer layer 111 has a very low doping concentration compared to the doping concentration of the upper buffer layer 112. For example, the doping concentration of the $p^+$ semiconductor substrate 100 is about $10^{17}cm^{-3}$ and over, and the doping concentration of the lower buffer layer 111 is about $10^{12}\sim10^{15}cm^{-3}$, and the doping concentration of the upper buffer layer 112 is about $10^{16}\sim10^{18}cm^{-3}$. The conductivity type of the lower buffer layer 111 is p-type or n-type. Preferably, the lower buffer layer 111 is substantially intrinsic.

A $n^-$drift region 120 is formed on the upper buffer layer 112. A $p^+$ base region 130 by the selective diffusion of p-type impurity ions is formed in a predetermined region of the upper surface of the $n^-$drift region 120, and a $n^+$ emitter region 140 by the selective diffusion of n-type impurity ions is formed in a predetermined region of the upper surface of the $p^+$ base region 130.

A gate dielectric layer 160 is formed on the upper surface region of the $p^+$ base region 130 between the $n^+$ emitter region 140 and the $n^-$drift region 120, the upper surface region in which an inversion layer as a channel region for moving an electron current from the $n^+$ emitter region 140 to the $p^+$ semiconductor substrate 100 through the $n^-$drift region 120 is formed. A gate electrode 170 formed of, i.e., polysilicon, is formed on the gate dielectric layer 160. An emitter electrode 150 is formed so as to be electrically connected to the $n^+$ emitter region 140, and a collector electrode 180 is formed so as to be electrically connected to the $p^+$ semiconductor substrate 100. Meanwhile, the emitter electrode 150 and the gate electrode 170 are insulated each other by an oxide film (not shown) functioning as an interdielectric layer.

Likewise, the characteristics of the insulated gate bipolar transistor having the structure of the low doping concentration lower buffer layer 111 and the high doping concentration upper buffer layer 112 will be below described.

First, in a forward blocking mode in which the gate electrode 170 and the emitter electrode 150 are short-circuited and a positive (+) voltage with respect to the emitter electrode 150 is applied to the collector electrode 180, a depletion layer, which is formed on a junction between the p$^+$ base regions 130 and the n$^-$ drift region 120 and extends into both directions, does not extend to the p$^+$ semiconductor substrate 100 due to existence of the n$^+$ buffer layer 112. Thus, the thickness of the n$^-$ drift region 120 can be reduced, as a result, on-state losses of a device can be reduced. During a forward conduction (in a case where a predetermined voltage is applied to the gate of the device, and then a channel is formed), the higher the concentration of the n$^+$ upper buffer layer 112 is and the larger the thickness of the n$^+$ upper buffer layer 12 is, hole injection from the p$^+$ semiconductor substrate 100 to the n$^-$ drift region 120 is suppressed, and then, the switching speed of the device is increased.

Next, in a reverse blocking mode in which a voltage is not applied to the gate electrode 170 and a negative voltage (−) with respect to the emitter electrode 150 is applied to the collector electrode 180, a breakdown voltage level is increased by the lower buffer layer 111 of the buffer layer 100, that is, an intrinsic i (or n$^-$, or p−) region.

More specifically, referring to FIG. 4, since the lower buffer layer 111 of the buffer layer 110 is a low doping concentration, a field applied in the lower buffer layer 111 changes sloppy in a reverse blocking mode, and then, a field distribution between the n$^+$ upper buffer layer 112 and the p$^+$ semiconductor substrate 100 is in a trapezoid shape. As described previously, since the breakdown voltage level which can be obtained in the reverse blocking mode is the same as the area of the trapezoid (A$^2$ of FIG. 4), the breakdown voltage higher than the breakdown voltage in case of a conventional triangular field distribution can be obtained.

First, referring to FIG. 5A, a p$^+$ semiconductor substrate 100 is provided. Then, a low doping concentration lower buffer layer 111 is formed on the p$^+$ semiconductor substrate 100. The lower buffer layer 111 can be formed by an epitaxial growth method. Here, the conductivity type of the lower buffer layer 111 is n-type or p-type impurities, or substantially intrinsic i, as a result, the doping concentration of the lower buffer layer 111 is very low. For example, the doping concentration of the p$^+$ semiconductor substrate 100 is about $10^{17}$cm$^{-3}$ and over, and the doping concentration of the lower buffer layer 111 is about $10^{12}$~$10^{15}$cm$^{-3}$. For this purpose, the above conductivity type and doping concentration are provided by growing the lower buffer layer 111 using the epitaxial growth method and simultaneously by implanting n-type impurity ions in the lower buffer layer 111.

Next, referring to FIG. 5B, a n$^+$ upper buffer layer 112 is formed on the high doping concentration lower buffer layer 111. The impurity doping concentration of the n$^+$ upper buffer layer 112 is about $10^{16}$~$10^{18}$cm$^{-3}$. The n$^+$ upper buffer layer 112 is formed using the epitaxial growth method, similarly to the n$^-$ lower buffer layer 111. That is, the above impurity doping concentration is provided by growing the upper buffer layer 112 on the low doping concentration lower buffer layer 111 using the epitaxial growth method and simultaneously by implanting n-type impurity ions in the upper buffer layer 111.

Next, referring to FIG. 5C, a n$^-$ drift region 120 is formed on the n$^+$ upper buffer layer 112, and similarly, the epitaxial growth method can be used.

The following process is the same as the process of fabricating a conventional insulated gate bipolar transistor.

That is, as shown in FIG. 3, p-type impurity ions are implanted on the n$^-$ drift region 120 after forming a first oxide film pattern. The p$^+$ base region 130 is formed by selectively diffusing p-type impurity ions. After forming the p$^+$ base region 130, the first oxide film pattern is removed. After forming a second oxide film pattern, n-type impurity ions are implanted in the n$^-$ drift region 120. Next, the n$^+$ emitter region 140 is formed by selectively diffusing n-type impurity ions. After forming the n$^+$ emitter region 140, the second oxide film pattern is removed. Next, the emitter electrode 150, the gate dielectric layer 160, the gate electrode 170, and the collector electrode 180 are formed, and then, the insulated gate bipolar transistor according to the present invention is completed.

Figure 6A:
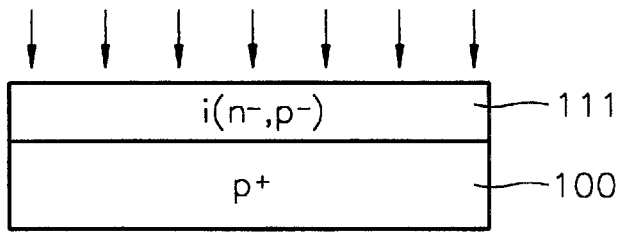
FIGS. 6A through 6C are sectional views illustrating another preferred embodiment of the method for fabricating the insulated gate bipolar transistor according to the present invention.

First, referring to FIG. 6A, a p$^+$ semiconductor substrate 100 used as a collector region is provided. A p$^-$ type or n$^-$ type lower buffer layer 111 is formed by implanting n-type impurity ions with a high doping concentration on the p$^+$ semiconductor substrate 100. Here, the impurity doping concentration of the p$^+$ semiconductor substrate 100 is about $10^{17}$cm$^{-3}$ and over, and the doping concentration of the lower buffer layer 111 is about $10^{12}$~$10^{15}$cm$^{-3}$.

Figure 6B:
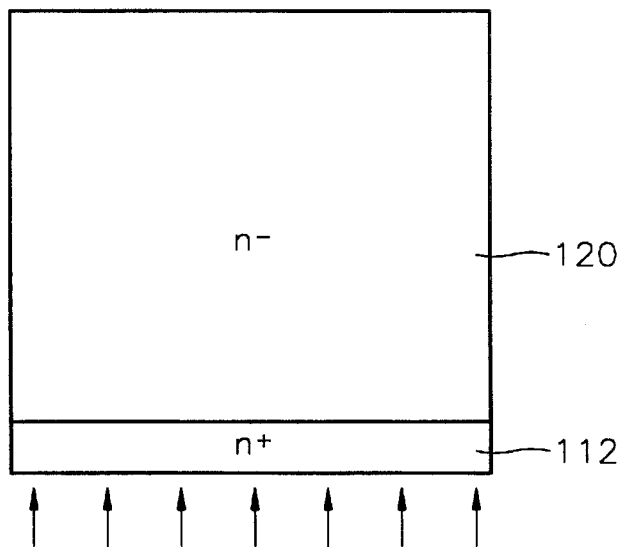

Next, referring to FIG. 6B, a n$^-$ semiconductor substrates 120 used as a drift region is provided. A n$^+$ upper buffer layer 112 is formed by implanting n-type impurity ions on the lower region of the n$^-$ semiconductor substrate 120. Here, the doping concentration of the n$^+$ upper buffer layer 112 is about $10^{16}$~$10^{18}$cm$^{-3}$.

Figure 6C:
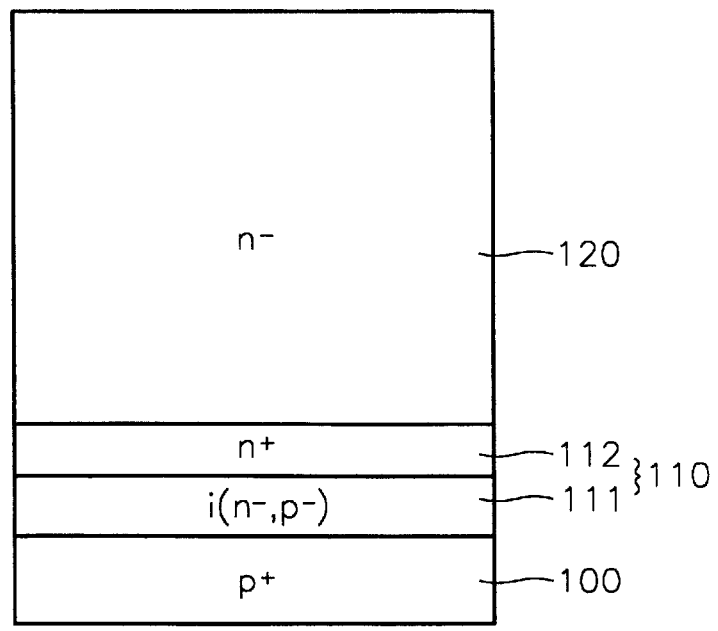

Next, referring to FIG. 6C, the p$^+$ semiconductor substrate 100 and the n$^-$ drift region 120 are attached so that the lower buffer layer 111 and the upper buffer layer 112 may contact each other. For this purpose, a silicon direct bonding method is used. That is, the two semiconductor substrates are fully attached to each other by heating and pressing in a state that the p$^+$ semiconductor substrate 100 and the n$^-$ drift region 120 contacts each other so that the lower buffer layer 111 and the upper buffer layer 112 may contact each other.

The following process is the same as the process of fabricating a conventional insulated gate bipolar transistor.

That is, as shown in FIG. 3, p-type impurity ions are implanted on the n$^-$ drift region 120 after forming a first oxide film pattern. The p$^+$ base region 130 is formed by selectively diffusing p-type impurity ions. After forming the p$^+$ base region 130, the first oxide film pattern is removed. After forming a second oxide film pattern, n-type impurity ions are implanted in the n$^-$ drift region 120 Next, the n$^+$ emitter region 140 is formed by selectively diffusing n-type impurity ions. After forming the n$^+$ emitter region 140, the second oxide film pattern is removed. Next, the emitter electrode 150, the gate dielectric layer 160, the gate electrode 170, and the collector electrode 180 are formed, and then, the insulated gate bipolar transistor according to the present invention is completed.

Figure 7:
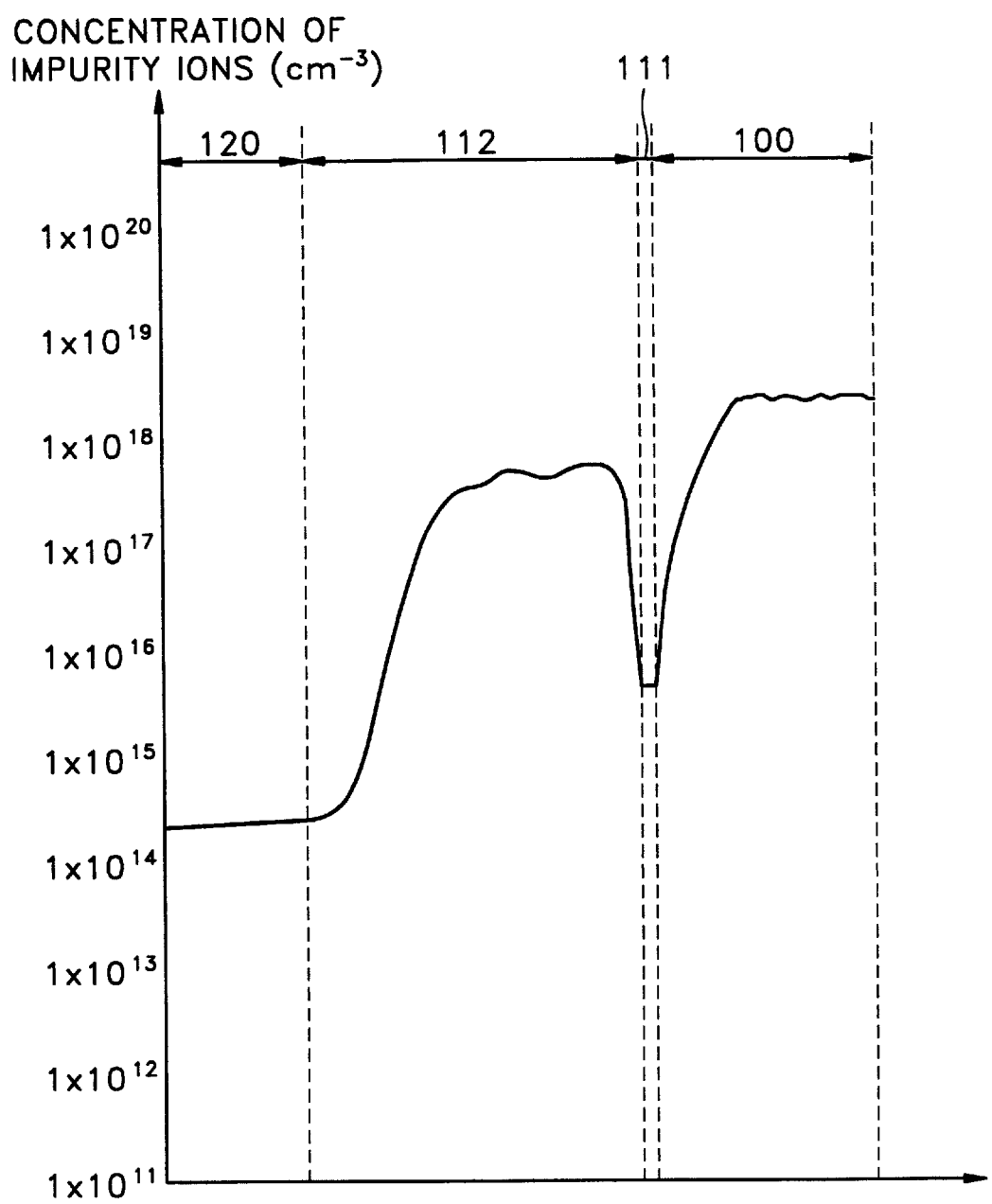
FIG. 7 is a graph illustrating an impurity distribution of the insulated gate bipolar transistor in which the method for fabricating the insulated gate bipolar transistor according to the present invention is implemented.

FIG. 7 is a graph illustrating an impurity distribution of the insulated gate bipolar transistor in which the method for fabricating the insulated gate bipolar transistor according to the present invention is implemented.

Here, the doping concentration of the semiconductor substrate 100 is $1\times10^{18}$~$1\times10^{19}$cm$^{-3}$, and the doping concentration of the upper buffer layer 112 is $1\times10^{15}$~$1\times10^{17}$cm$^{-3}$, and heating in the following diffusion process is performed at about 1150° C. for about three hours.

In this case, although impurity ions implanted in the semiconductor substrate 110 and the upper buffer layer 112 are diffused into the lower buffer layer 111 in the following heating process and thus, the thickness of the lower buffer layer 112 is reduced, as shown in FIG. 7, the nearly intrinsic lower buffer layer 112 still remains, and then, the effect of the present invention as described previously can be achieved.

As described above, since the upper region of the buffer layer, that is, the upper buffer layer contacting the low-concentration drift region has a high doping concentration, the present invention prevents the depletion layer formed on an epitaxial layer in a forward blocking mode from extending to the semiconductor substrate and can increase a switching speed during a forward continuity. Further, since the lower region of the buffer layer, that is, the lower buffer layer contacting the semiconductor substrate having a high doping concentration is intrinsic or has a very low doping concentration, the breakdown voltage is increased in a reverse blocking mode, and then, the reliability of a device is improved.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An insulated gate bipolar transistor comprising:

a semiconductor substrate having a high concentration of first conductivity type impurities;

a buffer layer formed of an upper buffer layer having a first doping concentration of second conductivity type impurities, which is formed over the semiconductor substrate, and a lower buffer layer having a second doping concentration lower than the first doping concentration, which is formed between the upper buffer layer and the semiconductor substrate;

a drift region of a second conductivity type formed on the upper buffer layer;

a base region of a first conductivity type formed in a predetermined region of the drift region;

an emitter region of a second conductivity type formed in the surface of a predetermined region of the base region;

a gate dielectric layer formed on a channel region of the base region;

a gate electrode formed on the gate dielectric layer;

an emitter electrode formed so as to be electrically connected to the emitter region; and a collector electrode formed so as to be electrically connected to the semiconductor substrate.

2. The insulated gate bipolar transistor according to claim 1, wherein the conductivity type of the lower buffer layer is first conductivity type impurities.

3. The insulated gate bipolar transistor according to claim 1, wherein the conductivity type of the lower buffer layer is second conductivity type impurities.

4. The insulated gate bipolar transistor according to claim 1, wherein t he lower buffer layer is intrinsic.

5. An insulated gate bipolar transistor comprising:

a semiconductor substrate having a high concentration of first conductivity type impurities;

a buffer layer formed of an upper buffer layer having a first doping concentration of second conductivity type impurities, which is formed over the semiconductor substrate, and a lower buffer layer having a second doping concentration lower than the first doping concentration, which is formed between the upper buffer layer and the semiconductor substrate, wherein the first doping concentration of the upper buffer layer is $10^{16}$~$10^{18}$cm$^{-3}$, and the second doping concentration of the lower buffer layer is $10^{12}$~$10^{15}$cm$^{-3}$;

a drift region of a second conductivity type formed on the upper buffer layer;

a base region of a first conductivity type formed in a predetermined region of the drift region;

an emitter region of a second conductivity type formed in the surface of a predetermined region of the base region;

a gate dielectric layer formed on a channel region of the base region;

a gate electrode formed on the gate dielectric layer;

an emitter electrode formed so as to be electrically connected to the emitter region; and a collector electrode formed so as to be electrically connected to the semiconductor substrate.

* * * * *